United States Patent
Courtney et al.

[11] Patent Number: 5,597,979
[45] Date of Patent: Jan. 28, 1997

[54] EMI SHIELDING HAVING FLEXIBLE CONDUSTIVE SHEET AND I/O GASKET

[75] Inventors: Daniel T. Courtney, Palmyra; Kenneth W. Hermann, Rochester; Stanley R. Miska, Pittsford, all of N.Y.

[73] Assignee: Schlegel Corporation, Rochester, N.Y.

[21] Appl. No.: 440,529

[22] Filed: May 12, 1995

[51] Int. Cl.$^6$ ........................................ H05K 9/00
[52] U.S. Cl. ......................... 174/35 R; 174/35 MS
[58] Field of Search ........................ 174/35 R, 35 GC, 174/35 MS, 51; 361/816, 818; 439/607, 608, 609, 610; 428/175

[56] References Cited

U.S. PATENT DOCUMENTS

| | | | |
|---|---|---|---|
| 2,875,435 | 2/1959 | McMillian | 343/18 |
| 2,913,577 | 11/1959 | Johnson | 250/20 |
| 3,383,455 | 5/1968 | Kerley, Jr. | 174/52 |
| 3,436,467 | 4/1969 | Smith, Jr. | 174/35 |
| 3,572,499 | 3/1971 | Mondano | 206/1 |
| 3,622,432 | 11/1971 | McCluer | 161/87 |
| 3,731,202 | 5/1973 | Meyers | 325/357 |
| 3,756,399 | 9/1973 | Cosier et al. | 174/52.3 X |
| 4,037,009 | 7/1977 | Severinsen | 428/241 |
| 4,227,037 | 10/1980 | Layton | 174/35 |
| 4,471,015 | 9/1984 | Ebneth et al. | 428/195 |
| 4,631,214 | 12/1986 | Hasegawa | 428/68 |
| 4,647,714 | 3/1987 | Goto | 174/36 |
| 4,654,755 | 2/1987 | Henderson et al. | 361/399 |
| 4,658,958 | 4/1987 | McNulty et al. | 206/328 |
| 4,678,699 | 7/1987 | Kritchevsuy et al. | 428/175 |
| 4,750,957 | 6/1988 | Gustafson | 156/92 |
| 4,774,148 | 9/1988 | Goto | 428/607 |
| 4,785,136 | 11/1988 | Mollet et al. | 174/35 R |
| 4,863,789 | 9/1989 | Arai | 428/253 |
| 4,896,001 | 1/1990 | Pitts et al. | 174/35 MS |
| 5,005,106 | 4/1991 | Kiku | 174/35 R X |
| 5,008,486 | 4/1991 | Terakawa et al. | 174/35 MS |
| 5,023,394 | 6/1991 | Watanabe et al. | 174/35 R |
| 5,031,076 | 7/1991 | Kiku | 361/424 |
| 5,115,140 | 5/1992 | Rodriguez | 250/516.1 |
| 5,134,245 | 7/1992 | Katz | 174/35 R |
| 5,136,119 | 8/1992 | Leyland | 174/35 R |
| 5,137,782 | 8/1992 | Adriaensen et al. | 428/370 |
| 5,164,542 | 11/1992 | Hart | 174/35 R |
| 5,166,864 | 11/1992 | Chitwood et al. | 174/35 R X |
| 5,170,009 | 12/1992 | Kadokura | 174/35 R |
| 5,198,290 | 3/1993 | Niioka | 428/263 |
| 5,226,210 | 7/1993 | Koskenmaki et al. | 29/527.5 |
| 5,239,125 | 8/1993 | Savage et al. | 174/35 MS |
| 5,270,493 | 12/1993 | Inoue et al. | 174/253 |
| 5,394,304 | 2/1995 | Jones | 361/816 X |
| 5,436,803 | 7/1995 | Annis et al. | 361/818 |

FOREIGN PATENT DOCUMENTS

| | | |
|---|---|---|
| 0460469A1 | 12/1991 | European Pat. Off. . |
| 3638123 | 5/1988 | Germany . |
| 3-276799 | 12/1991 | Japan . |

*Primary Examiner*—Bot L. Ledynh
*Attorney, Agent, or Firm*—Eckert Seamans Cherin & Mellott

[57] ABSTRACT

An electronic device is shielded against electromagnetic interference using a flexible conductive sheet forming a shield barrier or enclosure. The sheet has electrically insulating polymer material exposed on the surface of at least one face. Conductive material is embedded in or laminated on the sheet so as to be exposed selectively. More particularly, a nonconductive surface area is formed, especially oriented inwardly to avoid electrical shorts, but also exposed inwardly or outwardly where necessary to ground the shield barrier or to engage with another conductive body. The flexible sheet can form a loose envelope with a flange-like gasket at an open end. The gasket can be used to improve physical contact with a conductive body, and preferably also admits I/O connectors that need to traverse the shield barrier, and advantageously have external shielding that is grounded to the shielding barrier for continuing the shielding enclosure. Alternatively or additionally, openings are provided in the sheet for access, the conductive material being insulated around a perimeter or the openings by insulating lips which prevent unwanted shorting. This permits changing or adding circuit chips without removing the shield, and can be provided with a flap closure for minimizing the gap in the shield. The flexible envelope can be joined to a circuit ground by clamping the gasket or the conductive fibers on an exposed face to a the I/O connector, to a common ground, or to an external grounded panel.

18 Claims, 5 Drawing Sheets

EMI SHIELDING HAVING FLEXIBLE CONDUSTIVE SHEET AND I/O GASKET

BACKGROUND OF THE INVENTION

1. Field of the Invention

The invention relates to improvements in shielding for blocking propagation of electromagnetic interference ("EMI") associated with circuits, housings and subassemblies, of a type using a flexible electrically conductive sheet material that loosely encloses a source of EMI or a circuit susceptible to EMI, and thereby prevents high frequency energy from passing a shielding boundary.

According to certain inventive aspects, the flexible sheet material can be combined with or formed to define a gasket that is conductively sealable to an opposed conductive element such as a housing or backplane panel. This is useful to continue a conductively sealed enclosure at the perimeters of openings, for example, among other possibilities, around input/output connectors which traverse a shielding boundary.

The sheet material can have an electrically conductive surface exposed on one of two opposite faces of the sheet material, the other face being insulated such that contact with the shielded circuit does not produce an electrical short. Preferably, however, selectively conductive and insulated areas are provided on both sides of the sheet, for achieving certain objects. For example, a positive connection can be made by an exposed conductive surface on at least one side of the sheet material, for contact with one or more of the electronic equipment, a shielded circuit therein and a connector traversing a shielding boundary, typically for connecting to a circuit ground.

The sheet material can comprise one or more openings for access through a conductive area, for example at which the sheet material comprises a conductive flap overlying a hole in the sheet material. In the event of such openings, an insulating lip can be provided surrounding the opening. The conductive material can be spaced back from the edges of the opening, or covered over by an insulating surface material adjacent the edges, the insulating lip preventing electrical shorting adjacent the opening.

The sheet is suitable for the shielding of various types of electrical circuits including, but not limited to printed circuit cards of portable computers, notebook or palmtop devices, disc drives, power supplies and internal circuit subassemblies, and similar compact electronic devices for which signal or power conductors pass through the shielding boundary. The invention permits a nearly continuous and effectively gapless enclosure to be made and conveniently used for shielding relatively high frequencies associated with modern electronic equipment.

2. Prior Art

It is known to enclose electric circuits in a conductive enclosure coupled to a circuit ground, to attenuate electromagnetic radiation emitted from or received by the circuits. A conductive shielding enclosure may have gaps, which may or may not adversely affect the shielding efficiency or the extent of attenuation, depending on the frequencies to be shielded. To attenuate relatively high frequency radiation effectively, any gaps must be correspondingly small.

In connection with computing and radio communications equipment, the frequencies of clock oscillators, multiplying phase locked loops and similar circuits may be quite high. The basic clock speed of a conventional personal computer, for example, typically ranges from 25 to 100 MHz, and advances are pushing clock speeds upwardly. Circuits producing signals at different frequencies produce harmonics at the sum and difference of the frequencies. Data and clock signals comprising square waves are also characterized by harmonics. A computer or the like thus may produce objectionable harmonics up to 900 MHz and higher, requiring a very intensive shield, i.e., a nearly gapless enclosure which is quite conductive and is placed close to the circuits that emit or are sensitive to the electromagnetic radiation.

The most common forms of shielding comprise one or both of sheet metal structures forming boxes, and conductive plastic materials or coatings. A normally-nonconductive plastic can be made conductive by including metal fibers or particles, by applying a metallic coating layer, or by laminating the housing from a series of conductive and nonconductive sheets. Such techniques are disclosed, for example, in U.S. Pat. Nos. 5,137,782—Adriaensen, et al. (embedded wires); 5,164,542—Hart (laminated wire screen); 5,170,009—Kadokura (electrodeposited coating); and 5,226,210—Koskenmaki, et al. (conductive paint coating). Such techniques provide a form of shielding, but add to manufacturing complexity, particularly if the internal surface facing the shielded circuitry must be made nonconductive to avoid shorting, free of gaps, for example caused by scratching a coating, and provided with sufficient conductive and/or magnetically permeable material to substantially attenuate incident fields.

Although the most common shield material is sheet metal, shields can be made using metallized plastics. A product known as QuietShield, available from AMP, Inc., employs laminates of metalized plastic fabric and selectively applied insulating layers and adhesives, enabling the material to be folded into box-like shapes. In general, such products benefit from the low weight of the plastic materials and the capability of folding them.

Another possibility is to apply an insulating plastic coating directly on a circuit, component, or metal shield barrier. In U.S. Pat. No. 4,670,347—Lasik et al. insulating materials are laminated with a metal ink layer. In U.S. Pat. No. 5,166,864—Chitwood et al., or Japanese Patent Application H 2-77276—Kuno et al. (laid open Dec. 6, 1991), insulated shielding materials are attached directly onto a circuit card populated with components. This places the conductive material over the components, but is substantially permanent.

According to commonly owned U.S. patent application Ser. No. 08/168,939, filed Dec. 12, 1993, now U.S. Pat. No. 5,436,803, shielding can be advantageously provided in the form of a flexible nonconductive envelope with embedded conductive material such as sheet metal or conductive fibers sufficient to provide a low resistivity as needed for electromagnetic shielding, namely on the order of $10^{-1}$ to $10^{-2}$ $\Omega/\square$ or less, and a nonconductive surface facing toward the shielded circuit. The envelope forms a loose flexible shielding bag and is arranged around the shielded circuit. An opening such as a shielded neck leading to an opening can be provided for input/output conductors which traverse the boundary of the envelope. The envelope is grounded, for example, to a ground on the electronic equipment contained within the envelope, or to a ground point on an input/output connector, etc.

It is known to provide electrostatic discharge protection as a permanent feature of a circuit card mounting, for example as in U.S. Pat. No. 5,005,106—Kiku, where such a structure protects the circuitry of an integrated circuit bank card or smartcard from electrostatic discharge, and resides in a plastic housing with the circuitry. This unit is self contained, and thus the electrostatic discharge material does not interfere with other aspects of circuit operation and mounting. The discharge-protective structure does not form a complete envelope around the affected circuit. Kiku uses a minimally conductive film rather than highly conductive embedded material as needed for shielding against electromagnetic interference. No means are provided such as an extension neck, access opening or the like for dealing with passage of conductors or access to the circuit elements.

It is known to provide an opening in an RF shield through which conductors can pass. U.S. Pat. No. 3,383,455—Kerley discloses an RF shield in the form of an elongated sleeve constructed of a metal mesh which encapsulates an electrical component to be shielded. A small opening is provided in the sleeve which is fitted with an insulating grommet, the opening providing an egress for the lead wires which originate from the component. The grommet appears to provide abrasion protection for the lead wires in the event mechanical vibration causes movement between the lead wires and the sleeve. Since the lead wires are isolated from the sleeve by the insulating grommet, the sleeve is not in any way electrically coupled to the lead wires. The grommet has a circular opening and several round conductors are passed through that opening, leaving gaps between the lead wires and the grommet. This type of arrangement is not structured to provide high attenuation in high frequency shielding applications.

U.S. Pat. No. 4,785,136—Mollet et al. discloses an EMI shielding cover for a computer terminal. The shielding cover is formed from a conductive fabric sheet. The conductive sheet has an opening with re-closable upper and lower tabs which provide a means for passing one or more cables through the sheet. Mollet is consistent with Kerley in that the conductive sheet is not in any way coupled to the ground or shield layer of the cable.

Circuits may be sensitive due to high gain, operation at high frequencies, the use of components and structures conducive to inductive or capacitive coupling, etc. Some of the same aspects may characterize circuits that emit offending high frequency electromagnetic radiation. To attenuate an incident EMI field in such situations requires substantially more conductive material arranged in a more complete conductive enclosure than may be needed, for example, to protect against damage from electrostatic discharge (ESD).

In view of the operational frequencies and character of many modem circuits, a reasonably adequate shield for EMI purposes would attenuate radiation at least by 50 to 60 dB over a frequency range of 30 MHz to 1.0 GHz or more. To achieve this the shield needs to be substantially continuous and must enclose the shielded circuits closely and completely, i.e., forming a closed highly conductive envelope. Whereas electrostatic discharge packaging may be sufficiently conductive to dissipate a static charge at a surface resistivity of $10^{+1}$ to $10^{+12}$ $\Omega/\square$, electromagnetic shielding for attenuating incident EMI fields has a surface resistivity of $10^{-1}$ to $10^{-7}$ $\Omega/\square$.

It would be advantageous to provide a flexible sheet which is formed at least partly into a flexible bag-like enclosure and is as highly conductive as a shield of rigid sheet metal panels and/or boxes. It would also be advantageous to provide a gasket which provides a conductive seal for input/output connectors which traverse the boundary of the enclosure. The present invention concerns a low-resistivity flexible shielding sheet that is formed at least partially into an enclosure that can be mounted in a device such as a portable computer or the like for shielding an included circuit assembly, or perhaps for shielding subassemblies forming part of the circuit assembly. The sheet can have conductive and insulated areas on both sides. At least one conductive area can provide a means for sinking EMI energy from the sheet to ground. At least one opening can be provided in a conductive area of the sheet, the opening providing access to the circuit and/or means for passing signal lines or power lines through the shield barrier. The conductive material is spaced back from the edges of the opening thereby defining an insulated edge which prevents shorting of electrical components on the circuit and/or other sensitive surrounding areas.

SUMMARY OF THE INVENTION

It is an object of the invention to provide electromagnetic shielding comprising a flexible conductive sheet of very low resistivity, an electrical surface insulation along at least part of an inside surface, and means optimally forming the sheet substantially into a barrier for attenuating incident EMI fields.

It is an object of the invention to provide high frequency electromagnetic shielding in the form of a flexible conductive sheet, insulated along at least part of an inside surface, and means for forming the sheet into an electrically continuous flexible envelope that can shield a circuit without providing a fixed, rigid or surface conforming shield structure.

It is another object to facilitate shielding of devices requiring access and/or passage of conductors through a shielding barrier, together with minimal gaps in the shield barrier.

It is another object to provide shielding for grounded or shielded connectors which pass through a sheet of shielding material by facilitating electrical connection between the connector ground and the sheet.

It is another object to provide high frequency electromagnetic shielding in the form of a flexible conductive sheet having selectively conductive and insulated areas on both sides.

It is another object to provide high frequency electromagnetic shielding in the form of a flexible conductive sheet having at least one conductive area formed with an opening at which the conductive area is spaced back from edges of the opening. The edges are insulated to provide a lip that prevents shorting of the shield to electrical components on the circuit.

It is also an object to provide a shield structure that is inexpensive and effective for shielding, and also is lightweight and compact as appropriate for portable electronic apparatus such as computers and communication devices.

These and other objects are accomplished in an electronic device such as a portable computer, shielded against electromagnetic interference according to the invention, using a flexible sheet that at least partially surrounds a circuit card within the housing of the device. The flexible sheet forms at least a partial shielding enclosure and has an electrically insulating flexible sheet and at least one area of conductive material such as sheet metal or conductive fibers embedded in the flexible sheet so as to define insulated and conductive areas on one or both sides of the sheet. The insulating sheet can comprise a thermoplastic polymer, for example comprising polyethylene, polyethylene terephthalate, polyvinyl chloride, or the like, and sufficiently flexible to form a loose fitting bag-like enclosure.

The conductive material can comprise elemental metal or alloy, metalized polymer, screen, wire mesh, knitted or braided conductive filament (e.g., a single or multifilament wire or conductively coated fiber), woven wire, metal fibers, metal alloy fibers, metallized nylon fibers, conductive fabrics or the like. The conductive bodies or particles are sufficiently dense to obtain a resistivity of $10^{-1}$ to $10^{-2}$ $\Omega/\square$. The sheet forms at least a partial hollow envelope, preferably flexible, with the conductive fibers coupled electrically across a seam, for example by heat sealing sufficiently to join the conductive fibers and die cutting, if necessary, outside of the seal.

According to an inventive aspect, a conductive EMI shielding gasket is formed integrally with the envelope, and provides a means by which the shield enclosure can be fixed to a further conductive body so as to provide a shield around the perimeter of any openings, connectors, conductors or the like that pass the shield barrier. The conductive gasket can be formed by folding an edge of the flexible sheet around a resilient means such that at least an area of conductive fibers face toward a conductive body against which the conductive gasket is to engage. The resilient means can be provided by the electrically insulating flexible sheet, forming an integral EMI gasket coupled to the flexible sheet. The resilient means or gasket can be provided in part by inserting a resilient material such as a polyurethane foam core or the like, against which the sheet is compressed against conductive housing surfaces when mounted.

In one embodiment the gasket is formed from a widened strip of the flexible sheet. The widened strip is folded to encapsulate a polyurethane foam core. The flexible sheet is then heat sealed or laminated to itself to complete the foam encapsulation, and formation of a gasket integral with the flexible envelope. The combined flexible envelope, embedded fibers and foam core can be die cut as needed to the desired shape.

The gasket provides a physical contact between I/O connectors requiring electrical ground and the embedded fibers of the conductive sheet material. In application the gasket is pressed firmly against the connector or other conductive surface, thereby compressing the foam core. The resulting reactive force presses the flexible sheet and embedded fibers against the metal I/O connector shield or the like, to achieve good and continuous electrical contact.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

The invention provides a flexible shielding means that forms an attenuating barrier against propagation of electromagnetic radiation either into or out of an enclosure. The shielding means comprises a composite of conductive and nonconductive material, arranged such that the conductive material is protected from unwanted contact with circuit parts or housing parts, and is adapted to facilitate such contact where it is desirable.

The shielding material can comprise conductive particles, fibers or filaments, for shielding against EMI, such as elemental metal or metal alloys, metallized polymer fibers, suspensions of conductive particles in a binder, etc. This material can be made generally in a flexible enclosure or part enclosure, that is as effective for EMI shielding as a sheet metal box arrangement, but due to its flexibility and loose bag or cover configuration, the shield of the invention is relieved of many of the manufacturing complexities and expenses associated with shaped boxes of metal, metallized plastic or the like.

Figure 1:
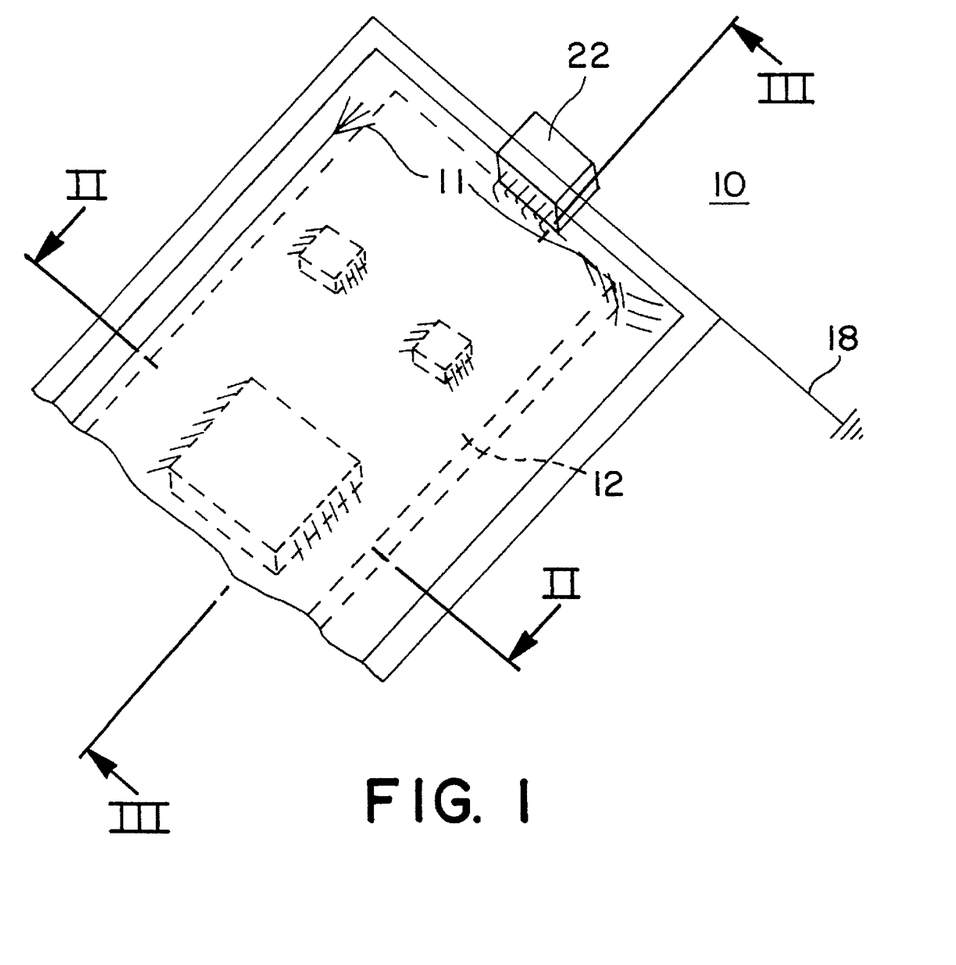
FIG. 1 is a perspective view of a circuit card enclosed within a thin, flexible electromagnetic shielding envelope according to the invention.

In the embodiment shown in FIG. 1, the shielding apparatus of the invention forms a flexible electrically conductive envelope 10 for the shielded circuit 12. The shielding apparatus is formed from an electrically insulating flexible sheet having a sheet of conductive fibers embedded therein. The conductive fibers are sufficiently dense and arranged in contact with one another, to obtain a resistivity, for example, of $10^{-1}$ to $10^{-2}$ $\Omega/\square$. This produces attenuation of electromagnetic interference or "EMI" of 50 to 60 dB over a frequency range 30 MHz to 1.0 GHz. The conductive fibers forming a conductive area 14 are spaced from at least one side of the flexible sheet forming an insulating area 16 that is directed toward the shielded circuit (see FIG. 2). The conductive fibers are coupled to circuit ground 18 via a suitable connecting element (not shown in FIG. 1 ) such as a screw passed through the shielding envelope, or a conductive portion of the flexible sheet being pressed firmly against the exterior of a grounded surface, I/O connector or the like.

In the embodiment shown in FIG. 1, two thicknesses of the sheet and its embedded fibers are attached at their edges to form a barrier 10 that as shown can be a two or more sided bag flexibly sized to receive at least one electrical circuit or device, such as a primed circuit card, disc drive, power supply or other subassembly, or perhaps an entire set of subassemblies forming the operative portions (within a housing) of a complete device such as a computer or the like. Whereas the insulating layer 16 (see FIG. 2) is oriented inwardly toward the electrical circuit, the shielding enclosure may reside very close to the circuit elements, preferably rests against certain of the circuit elements, and can move over the circuit elements because the conductive fibers are insulated from electrical contact by the nonconductive flexible sheet 16, and remain spaced slightly from the electrical elements. Thus the structure resembles a loose shielding bag. Close positioning of the conductive portion 14 of the shield to the circuits in fact improves shielding effectiveness as compared to a conductive barrier that is spaced further from the shielded element.

Referring again to FIG. 1, at one end of the envelope a conductive I/O connector 22 is provided that allows an external element operatively to connect to the enclosed circuit card. Elsewhere on the envelope, an extension or neck (not shown) also can be provided to allow the shield enclosure to extend outwardly of the envelope, for example to accommodate conductors (not shown). Such a neck is useful, for example, when the I/O connector is arranged to carry signals through a wall of a conductive housing that shields a device, whereas the neck permits conductors to couple to other elements within the housing.

The conductive material can be sheet metal, screen, wire mesh, knitted or braided wire or other conductive fiber(s) or filament(s), woven wire, metal fibers, metal alloy fibers, metallized nylon fibers, conductive fabrics or the like. The conductive material is embedded in the flexible sheet in an amount sufficient to form an electrically conducting layer while also maintaining flexibility of the flexible sheet. According to one embodiment, the conductive material is conductive fibers formed from silver metallized nylon fibers, for example with 24 to 30% by weight of silver applied by an electro-less plating process. Copper or a copper-nickel alloy can also be used (e.g., at 40 to 60% by weight).

The conductive fibers preferably form a nonwoven batt with a sufficient proportion of the adjacent fibers in electrically conductive contact to obtain a resistivity of $10^{-1}$ to $10^{-2}$ $\Omega/\square$. Because only small-dimension gaps remain, between conductive fibers in the shielding material, the shielding barrier is effective for attenuating relatively high frequencies.

The flexible insulating sheet can be a thermoplastic polymeric material, such as polyethylene, polyethylene terephthalate, polyvinyl chloride, or the like, polyethylene being most preferred. According to an aspect of the invention, the thermoplastic nature of the insulating layer enables adjoining portions to be attached by heat welding facing portions.

Figure 2:
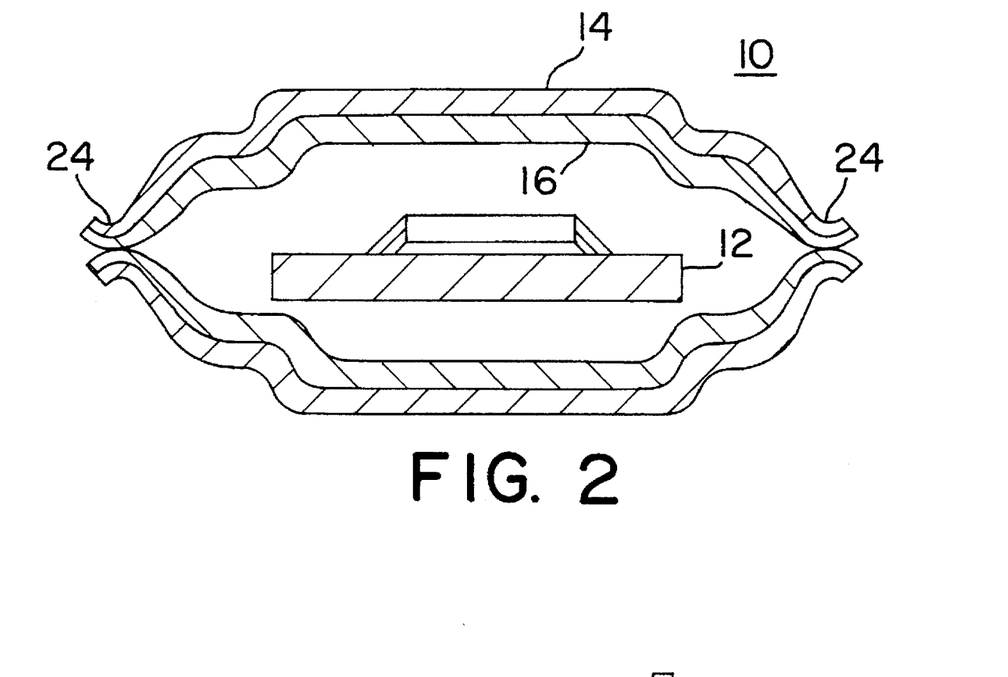
FIG. 2 is a cross sectional view of the arrangement of FIG. 1 along line 2—2.

Accordingly, as shown in FIG. 2, the conductive material, such as conductive fibers, can be arranged to continue the shielding barrier across one or more seams 24 where the adjacent edges of the flexible sheet and embedded conductive fibers come together. It is also possible that the adjacent portions can be attached by sewing, taping, adhering via a preferably-conductive adhesive, or by a mechanical fastening such as a slot and bead (Zip-lock) means. According to one arrangement, continuing the electrically conductive nature of the material across a seam 24 is accomplished by heat welding the edges of the material at the seam so that the conductive fibers come into electrical contact. This can be accomplished readily due to the thermoplastic nature of the insulating sheet and the preferred conductive fibers.

A heat operation can be used to compress and melt the sheet at the seam, for bringing conductive filaments into electrical contact across the seam. The seam can then be trimmed, for example by die cutting, outside of the point at which electrical contact is made across the seam.

Alternatively, the sheet can be sheared and heat sealed, preferably with compression, for causing the conductive fibers on the edges adjacent the seam to electrically engage, while simultaneously cutting through the two sheets. Hot cutting causes the thermoplastic insulating material and the conductive fibers embedded therein to melt and reform along the seam line. It would also be possible to provide other specific means to heat and compress the sheets with similar results to that obtained with a heated knife, such as ultrasonic welding together with compression, and this technique can also be used to provide shielding material that subdivides a shielded enclosure into two or more subenclosures.

The insulating sheet is preferably a thin, flexible, polyethylene sheet but having sufficient thickness to resist incidental damage, for example of 40 to 60 lbs./ream (0.2 to 0.3 g/cm$^2$), preferably 48 lbs./ream (0.25 g/cm$^2$). The embedded conductive material can be, for example, a metal plated nylon fiber. An HCl bonded silver plated nonwoven nylon fiber is a preferred fiber material, such as silver Cerex (a trademark of James River-Norwalk, Inc., Norwalk, Conn.). Another possible material is point-bonded silver plated non-woven nylon fiber, such as PBN-II (a trademark of Fiberweb North America, Inc., Greenville, S.C.). These materials allow a conductive seam to be formed simply by heating and compressing to electrically join the conductive fibers through two or more layers. The structure is formed generally into a hollow flexible envelope that loosely, but preferably also closely, surrounds the shielded circuit card or other component, and is coupled to a ground point on the circuit, housing or the like.

The metallized fiber can be embedded in the insulating sheet, for example by extrusion coating the nonwoven metallized fiber batt with the polyethylene or other insulating material.

Figure 3:
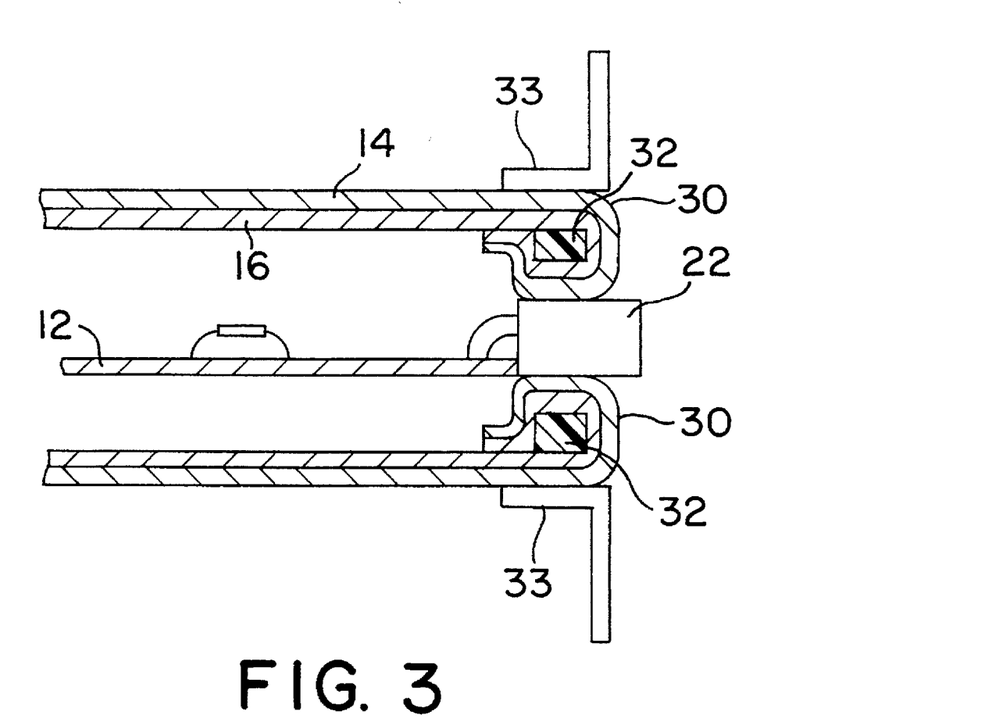
FIG. 3 is a side sectional view of the arrangement of FIG. 1 along line 3—3.

FIG. 3 shows the physical connection between a flexible sheet 30 and the conductive I/O connector 22 which provides an electrical ground point. A first and second gasket are formed in the edges of the flexible sheet and embedded fibers. In application the gaskets are pressed firmly against the exterior of the conductive I/O connector, for example from external pressure as shown generally by flanges 33, thereby compressing the foam core 32. The resulting reactive force presses the flexible sheet and embedded fibers against the exterior of the I/O connector.

Figure 4:
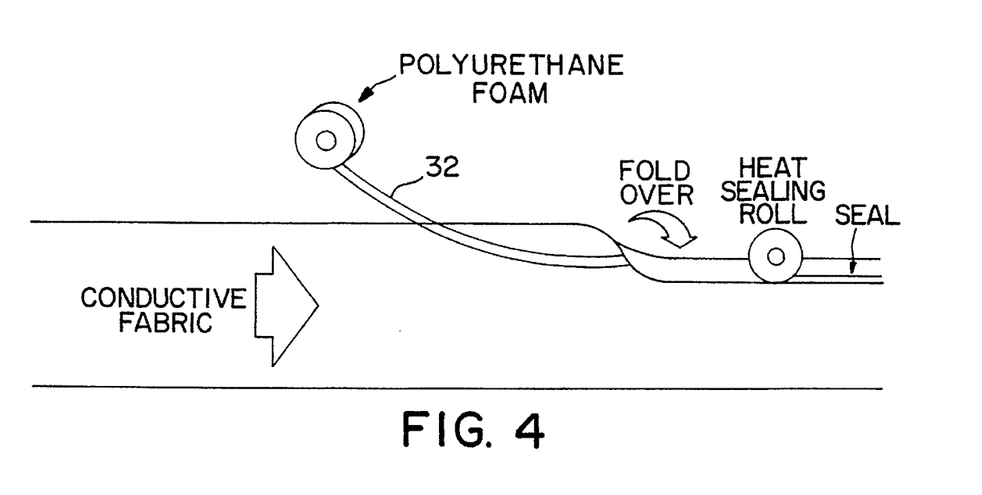
FIG. 4 shows the process of making a gasket in accordance with the invention.
Figure 5:
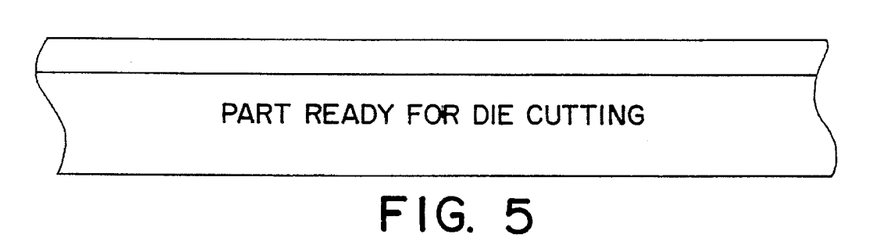
FIG. 5 shows a from view of a flexible sheet in combination with a gasket in accordance with the invention which is ready for die cutting.

In the embodiment shown in FIG. 4, the gasket is formed in the flexible sheet and embedded fibers by placing a foam core 32 such as a strip of polyurethane foam or the like along an edge or widened strip of the flexible sheet and embedded fibers. The widened strip is folded over thereby encapsulating the foam core. The flexible sheet and embedded fibers are then heat sealed or laminated to itself, to complete the foam encapsulation. The combined flexible sheet, embedded fibers and foam structure as shown in FIG. 5 can then be die cut to the desired shape.

The foam can comprise polyurethane in the 5–60 lb (2.3–27 kg) ILD range having a density of 1 to 6 lbs/ft$^3$ (0.016 to 0.1 g/cm$^3$), the lighter ends of the ranges being preferred for portable electronic devices to reduce weight.

Alternatively the gasket can be formed in the flexible sheet and embedded fibers with out using a resilient core of polyurethane foam or the like. The flexible sheet can be manufactured from a suitably compressible material such that an additional core of compressible material is not required. For example, the sheet can be formed from a thick foam. When the sheet is folded over into a double thickness of thick foam, it is compressible and forms a gasket due to compression of the foam.

Figure 6:
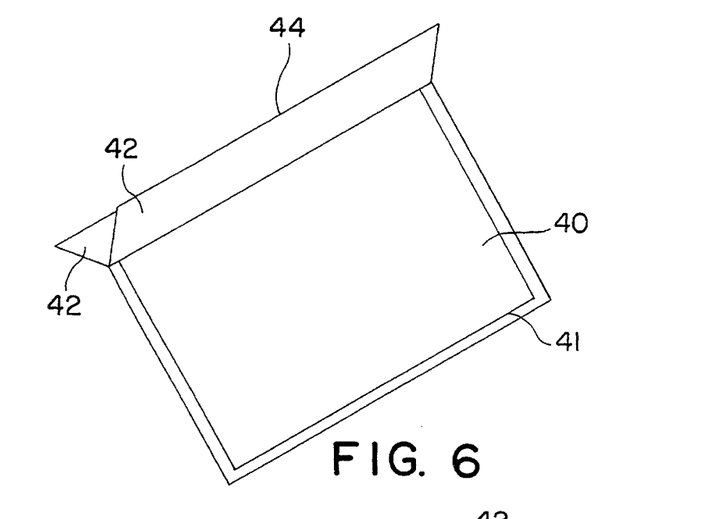
FIG. 6 shows an alternate embodiment wherein the flexible sheet is formed into an envelope having a first and second flap.

The invention is also suitable for applications in which the flexible sheet generally defines an envelope that is open at one end, which end is formed to provide a means for coupling the envelope to other shielding or mounting surfaces via a conductive gasket formed at the end, preferably integrally with the material of the envelope walls. The "envelope" can have a seam arrangement forming edges and corners in the manner of a bag, or for relatively thin components such as circuit cards, the envelope can be formed by two flat sheets joined around a perimeter seam residing in a common plane as in FIGS. 6–8. For example, envelope 40 in FIG. 6 is formed with a seam 41 around the perimeter of two sheets, but for a first and second flap 42 at an open end 44. The flaps 42 can be engaged under a conductive flange or the like (not shown in FIG. 6) to achieve an electrical connection.

Figure 7:
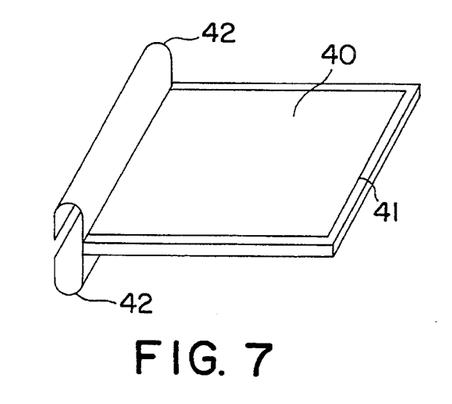
FIG. 7 shows the envelope of FIG. 6 wherein the first and second flaps are folded to form a first and second gasket.

In FIG. 7, the flaps 42 are folded over to double their thickness, thus providing compressible gasket shapes (due to the compressibility of the foam) that can be received between two opposed conductive elements (not shown). In addition, as shown in FIG. 3 and discussed above, resilient core elements (32 in FIG. 3) can be incorporated in the folded over flaps 42 of FIG. 7.

In operation the gaskets provide a compressible union between the envelope and a shielding or mounting surface, particularly useful for obtaining a substantially gapless electrical connection between the shielding material of the envelope and the conductive material of a housing, circuit card flange or the like. The first and second gaskets are pressed against the shielding or mounting surface with compression of the gasket.

Figure 8:
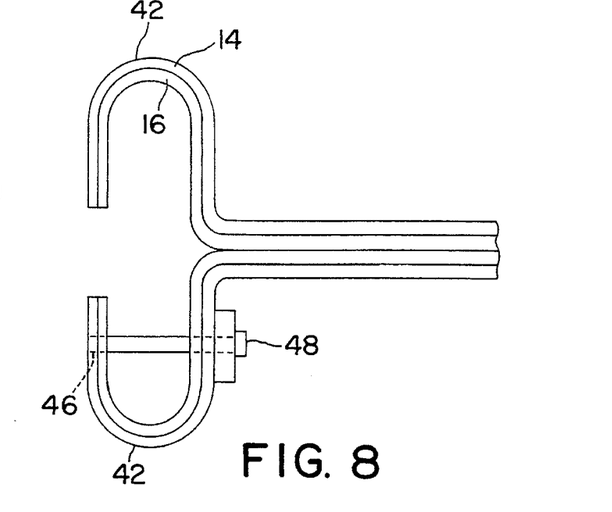
FIG. 8 is a side view of the first and second gasket of FIG. 7.

FIG. 8 is a side view showing the folded over gasket flaps 42 with the conductive material 14 spaced from the area between the facing sheets by the insulating layer 16. In this arrangement, material 14 forms a conductive outer surface and the inside of the envelope is insulated. This flexible envelope can be connected to an external surface by clamping or bonding the gaskets to the surface via a conductive adhesive. Alternatively, the gaskets can be formed with at least one hole 46 thereby allowing a fastener 48 to be passed though the gasket in order to fasten the gasket to an external device, surface or the like, and if desired to make a through electrical connection.

Figure 9:
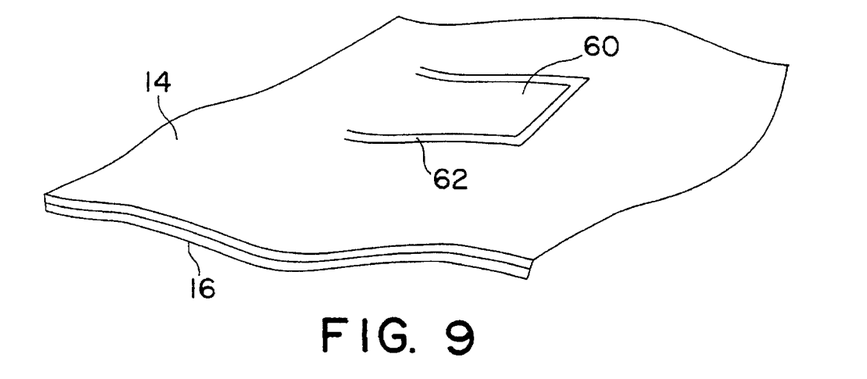
FIG. 9 shows an alternate embodiment wherein the flexible sheet has an opening and the edge of the conductive layer is insulated around a conductive flap.

It is also possible to provide selective areas on either or both of the inner facing and outer facing surfaces that are conductive or insulating, respectively, as required for a particular application. For example as shown in FIG. 9, it may be desirable to provide an access opening through the shielding envelope, while still obtaining shielding when the device is operational. In FIG. 9, an access opening is provided by a flap cut into the shielding material, preferably with means for protecting or insulating the edges of the flap and opening from electrical contact that could short the shield material to a point on the circuit (not shown in FIG. 9). Such an access opening is useful, for example, as a means for removing or inserting various components such as memory chips and support chips, upgrade processors, math co-processors and the like in computers.

Figure 10:
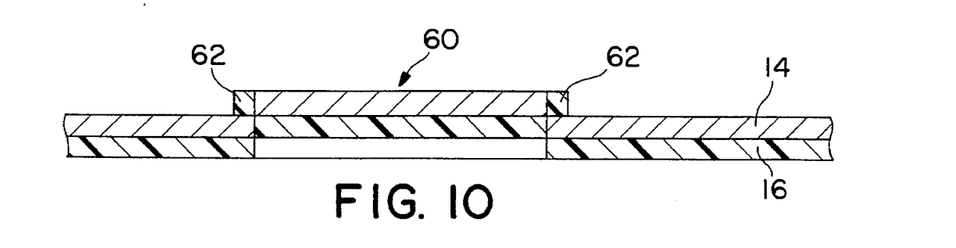
FIG. 10 is a sectional view of the flexible sheet of FIG. 9, the edge of the conductive layer of the flap being retained in the opening under the flap.

In FIGS. 9 and 10, the access opening is provided by a simple flap 60 cut around three edges such that the flap remains attached on the fourth edge. To prevent shorting of the conductive layer 14 along its edges against the circuit (not shown), means in the form of an insulating edge 62 can be provided around the periphery of the flap on the outer edges of flap 60 as shown in FIG. 10, or on the internal edge of the access opening, or both, to avoid contact both by covering the edge of conductive layer 14 and keeping flap 60 substantially on the surface of conductive layer 14 rather than dropping into the access opening. The conductive layer 62 can be limited to the edge or provided over a short perimeter area on the upper or lower sides of flap 60 or of the access opening. The conductive layer can be a bead of silicone, an insulating adhesively attached tape, or another insulating material for preventing shorting.

Figure 11A:
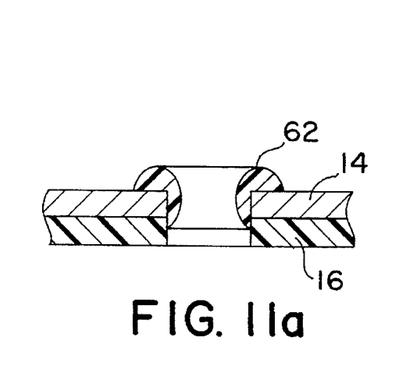
FIGS. 11a and 11b show alternate embodiments wherein the flexible sheet has selectively conductive and nonconductive surfaces on opposite surfaces and on edges of the material.
Figure 11B:
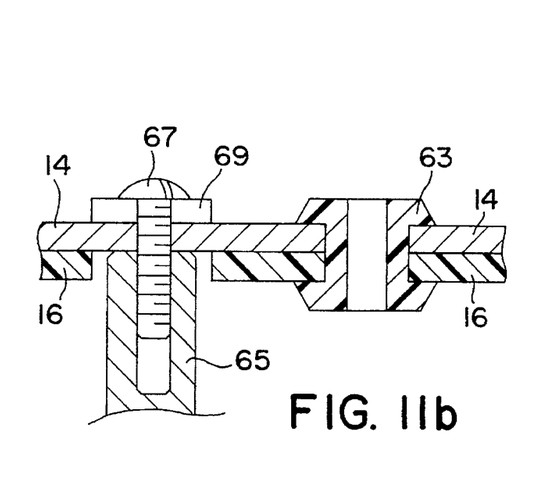

FIGS. 11a and 11b show two exemplary alternatives for insulating the conductive layer 14 around the edge of an opening. Such insulation may be appropriate for an access opening as in FIGS. 9 and 10, or otherwise needed to selectively provide surfaces on either or both of the internal and external surfaces. In FIG. 11a, a bead of insulating material 62 is applied sufficiently to cover over the edge surface of conductive material 14. In FIG. 11b, a grommet-like insulating body 63 is provided and overlaps the conductive and nonconductive surfaces 14, 16 on both sides, while also covering over the edge of conductive sheet 14.

It may also be desirable as shown in FIG. 11b to provide a selectively conductive layer on the side otherwise insulated by layer 16. For example, a connection to a circuit element shown generally as post 65 may be desirable to provide a ground connection, and in addition to making such a connection using a screw 67 and washer 69 to make an electrical connection between conductive layer 14 and post 65 through insulating layer 16, it may be further desirable to provide surface contact between the underside or inside of conductive layer 14 and the post, by providing a selectively conductive area on the inside of the shield, where such contact can be made. This can be accomplished, for example where insulating material 16 is applied or laminated to conductive sheet 14, by selective application of the insulating material via die cutting prior to lamination, or via selective application of a foam or other insulation to be cured in place.

The conductive material can be sheet metal, screen, wire mesh, knitted or braided wire or other conductive fiber or filament or yarn, woven or nonwoven wire, metal fibers, metal alloy fibers, metallized nylon fibers, conductive fabrics or the like. The conductive material is embedded in the flexible sheet so as to form at least an area of conductive material in which the opening, having at least one edge, is formed. The conductive material forms an electrically conducting layer while also maintaining flexibility of the flexible sheet.

The flexible insulating sheet can be a thermoplastic material, such as polyethylene, polyethylene terephthalate, polyvinyl chloride, or the like, polyethylene being most preferred. The thickness of the coating may vary depending on various factors such as, hardness of the coating, required hardness or softness of the combined insulating sheet and conductive material, dielectric strength of the insulating sheet and amount of reflow desired.

Any required opening, for example for circuit access or passage of conductors, is preferably formed by cutting the flexible sheet and embedded conductive material into the desired shape. The opening shown in FIG. 9 is essentially rectangular, but it will be appreciated that other shapes are possible and appropriate for particular uses.

The edges of one or both of the conductive layer and the insulating layer are selectively placed to cover or to expose the conductive material, to extend the flexible insulating sheet beyond the edge of the conductive material, or otherwise as appropriate. As an alternative to adding insulating material along an edge or the like, the insulating material adjacent the edge can be reworked by reflowing the insulating material using heat, pressure, ultrasonics, heat and pressure, and other methods suitable to cause the insulating material to flow over and insulate edges where needed. The rework process can be selective, such as reflowing only to cover exposed conductive edges around an opening or to remove insulating material in a selected area so as to achieve electrical contact. During or after a reflow operation additional steps such as cutting, addition of conductive or non-conductive materials, use of adhesives for attachment or forming of an enclosure and the like, can be conducted as needed to conform to particular requirements.

Whereas the conductive material is sufficiently dense to obtain a resistivity of $10^{-1}$ to $10^{-2}$ $\Omega/\square$, shielding enclosures formed from the conductive material can attenuate by at least 50 to 60 dB the high frequency electromagnetic radiation produced. Such radiation is typically generated on the order of the clock speed of the computer (e.g., 16 to 100 MHz or more) as well as the harmonics that are produced with generation of different frequency components and the ringing of the switched circuits. The material as described can provide such attenuation over a frequency range of 30 MHz to 1.0 GHz.

Remaining gaps in the conductive material can be filled with a flexible material to reduce porosity and improve flame retardant characteristics. Preferred flexible materials suitable for filling the conductive material include urethane, CPE, PVC, neoprene, latex and the like. The flexible insulation is selectively applied to the conductive material is preferably fire retardant and heat resistant to 100° C., a preferred sheet being 2 to 10 mils thick and having a dielectric strength of approximately 2,500 volts.

The shielding enclosure as described can have integral preferably-compressible conductive flaps or perimeter gaskets for electrical connection or can be used together with other gaskets, conductive adhesives, clamping means or the like suitable to maintain electrical connection.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

I claim:

1. An electromagnetic shield, comprising:

a flexible sheet comprising an electrically insulating material;

a conductive material substantially coextensive with the flexible sheet and defining a shielding barrier, the insulating material spacing the conductive material from at least an exposed insulating area on at least one surface of the flexible sheet on at least one side thereof, and the conductive material being exposed at another area on at least one side thereof, presenting an exposed contact area for coupling electrically to the conductive material;

wherein the flexible sheet substantially forms an enclosure for a circuit element, the enclosure having an opening, and wherein the insulating area and the contact area are arranged selectively, for protecting portions of the circuit element from contact with the conductive material, and for coupling the conductive material to a conductive body; and, wherein the flexible sheet comprises a flange associated with the opening, a part of the contact area being disposed on the flange.

2. The shield of claim 1, wherein the insulating area comprises an insulating lip of predetermined width extending around a periphery of the opening for protecting said portions of the circuit element from contact with the conductive material.

3. The shield of claim 1, wherein the flange is resiliently compressible, thereby forming a conductive gasket.

4. The shield of claim 3, wherein the gasket is formed at least partly by folding the flexible sheet adjacent the opening.

5. The shield of claim 4, further comprising a resilient core in the gasket, and wherein the flexible sheet is folded around the resilient core for resiliently bearing the contact area.

6. The shield of claim 1, wherein the flexible sheet is formed into a hollow envelope by at least one seam, and further comprising means for electrically connecting the conductive material across the seam.

7. The shield of claim 6, wherein the conductive material is exposed on a conductive side of the envelope opposite from the insulating face, and wherein the seam comprises a fold at which the conductive sides of adjacent portions of the flexible sheet are overlapped.

8. The shield of claim 1, wherein the opening is adapted to engage around an electrical connector having conductors for traversing the shielding barrier.

9. The shield of claim 8, wherein the electrical connector comprises an external conductive shield and the contact area is arranged to bear against said external conductive shield, for continuing the shielding barrier along the connector.

10. In combination, a shield and a shielded circuit element, comprising:

the shield having a flexible sheet comprising an electrically insulating material and a conductive material substantially coextensive with the flexible sheet and defining a shielding barrier, the insulating material spacing the conductive material from at least an exposed insulating area on at least one surface of the flexible sheet on at least one side thereof, and the conductive material being exposed at another area on at least one side thereof, presenting an exposed contact area for coupling electrically to the conductive material;

wherein the flexible sheet substantially forms an enclosure for the circuit element, the enclosure having an opening, and wherein the insulating area and the contact area are arranged selectively, for protecting portions of the circuit element from contact with the conductive material, and for coupling the conductive material to a conductive body; and, wherein the flexible sheet comprises a flange associated with the opening, a part of the contact area being disposed on the flange.

11. The combination of claim 10, wherein the insulating area comprises an insulating lip of predetermined width extending around a periphery of the opening for protecting said portions of the circuit element from contact with the conductive material.

12. The combination of claim 10, wherein the flange is resiliently compressible, thereby forming a conductive gasket.

13. The combination of claim 12, wherein the gasket is formed at least partly by folding the flexible sheet adjacent the opening.

14. The combination of claim 13, further comprising a resilient core in the gasket, and wherein the flexible sheet is folded around the resilient core for resiliently bearing the contact area.

15. The combination of claim 10, wherein the flexible sheet is formed into a hollow envelope by at least one seam, and further comprising means for electrically connecting the conductive material across the seam.

16. The combination of claim 15, wherein the conductive material is exposed on a conductive side of the envelope opposite from the insulating face, and wherein the seam comprises a fold at which the conductive sides of adjacent portions of the flexible sheet are overlapped.

17. The shield of claim 10, wherein the opening is adapted to engage around an electrical connector having conductors for traversing the shielding barrier.

18. The shield of claim 17, wherein the electrical connector comprises an external conductive shield and the contact area is arranged to bear against said external conductive shield, for continuing the shielding barrier along the connector.

* * * * *

UNITED STATES PATENT AND TRADEMARK OFFICE
CERTIFICATE OF CORRECTION

PATENT NO.   :   5,597,979
DATED        :   January 28, 1997
INVENTOR(S)  :   Daniel T. Courtney et al.

It is certified that error appears in the above-indentified patent and that said Letters Patent is hereby corrected as shown below:

On the cover page, in the title, delete "CONDUSTIVE" and substitute therefor --CONDUCTIVE--.

In Column 1, line 2, delete "CONDUSTIVE" and substitute therefor --CONDUCTIVE--.

In Column 5, line 65, delete "from" and substitute therefor --front--.

Signed and Sealed this

Fifteenth Day of July, 1997

Attest:

BRUCE LEHMAN

*Attesting Officer*     *Commissioner of Patents and Trademarks*